United States Patent
Cavallo et al.

(10) Patent No.: US 10,680,129 B1
(45) Date of Patent: Jun. 9, 2020

(54) RADIALLY STACKED SOLAR CELLS BASED ON 2D ATOMIC CRYSTALS AND METHODS FOR THEIR PRODUCTION

(71) Applicant: STC.UNM, Albuquerque, NM (US)

(72) Inventors: Francesca Cavallo, Corrales, NM (US); Vijay Saradhi Mangu, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 16/153,277

(22) Filed: Oct. 5, 2018

Related U.S. Application Data

(62) Division of application No. 15/692,541, filed on Aug. 31, 2017, now Pat. No. 10,141,469.

(Continued)

(51) Int. Cl.
*H01L 31/0236* (2006.01)
*H01L 31/0352* (2006.01)
*H01L 31/0725* (2012.01)
*H01L 31/032* (2006.01)
*H01L 31/0224* (2006.01)
(Continued)

(52) U.S. Cl.
CPC .... *H01L 31/0725* (2013.01); *H01L 31/02363* (2013.01); *H01L 31/022425* (2013.01); *H01L 31/032* (2013.01); *H01L 31/0392* (2013.01); *H01L 31/035281* (2013.01); *H01L 31/0547* (2014.12)

(58) Field of Classification Search
CPC .............. H01L 31/0725; H01L 31/02; H01L 31/022425; H01L 31/022416; H01L 31/02363; H01L 31/032; H01L 31/0352; H01L 31/035281; H01L 31/0392
See application file for complete search history.

(56) References Cited

U.S. PATENT DOCUMENTS

2009/0038678 A1 2/2009 Pan et al.
2010/0032812 A1 2/2010 Sedky et al.
(Continued)

OTHER PUBLICATIONS

Flory et al., "A WSe2/MoSe2 heterostructure photovoltaic device," Appl. Phys. Lett. 107, 123106 (2015); doi: 10.1063/1.4931621.

(Continued)

*Primary Examiner* — Susan D Leong
(74) *Attorney, Agent, or Firm* — MH2 Technology Law Group, LLP

(57) ABSTRACT

A solar cell for collecting solar radiation can include a barrier layer such as a dielectric barrier layer and a heterostructure including a first light absorbing layer and at least a second light absorbing layer. A method for forming the solar cell can include forming a sacrificial layer on a support substrate and forming the barrier layer on the sacrificial layer. The barrier layer is formed to have a strain gradient through its thickness. The heterostructure is attached to the barrier layer and the sacrificial layer is removed, thereby separating the barrier layer and the heterostructure from the support substrate. During the removal of the sacrificial layer, the strain gradient causes the barrier layer and heterostructure, to roll, curl, or spiral, thereby resulting in a radially stacked heterostructure that provides a light concentrating optical cavity having multiple light absorbing layers with different band gaps.

13 Claims, 5 Drawing Sheets

Related U.S. Application Data

(60) Provisional application No. 62/409,204, filed on Oct. 17, 2016.

(51) Int. Cl.
  *H01L 31/054* (2014.01)
  *H01L 31/0392* (2006.01)

(56) References Cited

U.S. PATENT DOCUMENTS

| | | | | |
|---|---|---|---|---|
| 2010/0317132 | A1 | 12/2010 | Rogers et al. | |
| 2013/0025657 | A1* | 1/2013 | Qi | H01G 9/2031 |
| | | | | 136/255 |
| 2013/0220406 | A1* | 8/2013 | Day | H01L 31/035281 |
| | | | | 136/255 |
| 2014/0017396 | A1* | 1/2014 | Whiteford | C07F 5/025 |
| | | | | 427/77 |
| 2014/0026958 | A1* | 1/2014 | Choi | H01L 31/0749 |
| | | | | 136/256 |
| 2014/0209160 | A1* | 7/2014 | Schroeder | H01L 31/02363 |
| | | | | 136/256 |

OTHER PUBLICATIONS

Furchi et al., "Photovoltaic Effect in an Electrically Tunable van der Waals Heterojunction," Nano Lett 14, 4785-4791, doi:10.1021/nl501962c (2014).

Lee et al., "Atomically thin p-n junctions with van der Waals heterointerfaces," Nat Nanotechnol 9, 676-681, doi:10.1038/Nnano.2014.150 (2014).

Mueller et al., "Atomically-thin van der Waals Heterostructure Solar Cells," Conf Laser Electr (2015).

Pezeshki et al., "Electric and Photovoltaic Behavior of a Few-Layer α-MoTe 2 /MoS 2 Dichalcogenide Heterojunction," Adv Mater 28, 3216-3222, doi:10.1002/adma.201504090 (2016).

Tahersima et al, "Enhanced photon absorption in spiral nanostructured solar cells using layered 2D materials," Nanotechnology 26, doi:Artn 34400510.1088/0957-4484/26/34/344005 (2015).

Tsai et al., "Monolayer MoS2 Heterojunction Solar Cells," ACS Nano 8, 8317-8322, doi:10.1021/nn502776h (2014).

* cited by examiner

RADIALLY STACKED SOLAR CELLS BASED ON 2D ATOMIC CRYSTALS AND METHODS FOR THEIR PRODUCTION

PRIORITY

This application claims the benefit of U.S. application Ser. No. 15/692,541, now allowed, which claimed benefit to U.S. Provisional Application No. 62/409,204, filed Oct. 17, 2016, each incorporated herein by reference in their entirety.

TECHNICAL FIELD

The present disclosure generally relates to solar cells and, more particularly, to a solar cell design and method for making the solar cell.

BACKGROUND

Generation of electrical power is increasingly relying on sources of renewable energy, including photovoltaic (PV) cells or solar cells. However, the cost of solar cells remains high and has heretofore prevented the wide commercial use of solar cells in consumer applications. Many research efforts focus on reducing the processing and materials cost or increasing the efficiency of the PV conversion from solar radiation to electrical energy. As a result, although PV devices are still mostly based on silicon, a multitude of other materials and device architectures have been investigated, including multiple junctions of III-V semiconductors, cadmium telluride (CdTe), copper indium gallium selenide (CIGS) combinations, organic films, and, more recently, perovskites and two-dimensional (2D, monolayer) atomic crystals. Among the latter, transition metal dichalcogenides (TMDCs or TMDs) have some unique properties and technological advantages which make them ideal candidate for high-efficiency, low-cost and stable PV devices, both in rigid and flexible form. Few to single atomic layers of TMDC are direct semiconductors with band-gap between 1 and 3 electron volts (eV). A large absorption per thickness has been reported for several TMDCs, including molybdenum disulfide ($MoS_2$) and molybdenum diselenide ($MoSe_2$). Absorption in a wide range of wavelengths can be achieved in a single TMDC by elastically straining it to a great extent. TMDCs can be stacked onto many different substrates, thereby offering an opportunity to create broad band absorbers to better match the solar spectrum. Recent progress into effectively printing TMDCs suggests an economical approach to their deposition over a large area.

A variety of heterostructure solar cells based on TMDC has been demonstrated, including $MoS_2/WSe_2$, $MoSe_2/WSe_2$, $MoS_2/$Graphene, $MoS_2/InP$, $\alpha$-$MoTe_2/MoS_2$, and $MoS_2/$p-Si. However, the reported absorption and conversion efficiencies are low, in the order of 5-10% and a few percent, respectively. These poor performances are due, at least in part, to a limited absorption of the solar radiation in active layers with atomic scale thickness. Unfortunately, TMDCs with a thickness larger than three atomic layers are indirect semiconductors with little to no absorption of the solar radiation.

Therefore, in order to harness the potential of TMDCs in photovoltaic applications, a new solar cell architecture is needed to enhance collection of light.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation of the present teachings, a method for fabricating a solar cell includes forming a sacrificial layer, forming a barrier layer having a gradient strain on the sacrificial layer, attaching a heterostructure including a first light absorbing layer and at least a second light absorbing layer to the barrier layer, wherein the second light absorbing layer is attached to the first light absorbing layer and thereby forms a heterojunction at an interface between the first light absorbing layer and the second light absorbing layer, and removing the sacrificial layer subsequent to the attaching of the first light absorbing layer and the second light absorbing layer to the barrier layer. The barrier layer, the first light absorbing layer, and the second light absorbing layer form a spiral structure having a spiral shape resulting from the gradient strain of the barrier layer. The sacrificial layer may be formed on a support substrate. Optionally, the first light absorbing layer may be a first transition metal dichalcogenide (TMDC) layer, the second light absorbing layer is a second TMDC layer, and the first TMDC layer is different than the second TMDC layer.

The spiral structure can include at least five windings. The method can further include forming a first electrical contact that electrically contacts the first light absorbing layer and forming a second electrical contact that electrically contacts the second light absorbing layer. The method can further include attaching a reflective core to the second light absorbing layer, wherein the reflective core is positioned at a center of the spiral structure subsequent to the removing of the sacrificial layer. The reflective core includes one or more of gold, aluminum, and silver, and has a diameter of from 0.5 micrometer (µm) to 2.0 µm. The reflective core may be attached to a first end of the second light absorbing layer, and the method can further include forming a first electrical contact to the first light absorbing layer and forming a second electrical contact that electrically contacts the second light absorbing layer, wherein the second electrical contact is formed at a second end of the second light absorbing layer that is opposite to the first end.

The method can optionally include depositing a plurality of nanostructures on the barrier layer prior to the attaching of the heterostructure to the barrier layer, wherein the first light absorbing layer is locally strained at each interface with each nanostructure. The first light absorbing layer can include at least one of molybdenum disulfide ($MoS_2$), molybdenum diselenide ($MoSe_2$), tungsten disulfide ($WS_2$), and tungsten diselenide ($WSe_2$).

In another implementation, a solar cell in accordance with the present teachings can include a barrier layer, a heterostructure attached to the barrier layer, wherein the heterostructure includes a first light absorbing layer and at least a second light absorbing layer attached to the first light absorbing layer, and a heterojunction at an interface between the first light absorbing layer and the second light absorbing layer. The barrier layer, the first light absorbing layer, and the second light absorbing layer form a spiral structure having a spiral shape. The first light absorbing layer can be or include a first transition metal dichalcogenide (TMDC) layer and the second light absorbing layer can be or include a second TMDC layer, where the first TMDC layer is different than the second TMDC layer. The spiral structure can include at least five windings.

In an implementation, the solar cell can further include a first electrical contact that electrically contacts the first light absorbing layer and a second electrical contact that electrically contacts the second light absorbing layer. The solar cell can include a reflective core attached to the second light absorbing layer, wherein the reflective core is positioned at a center of the spiral structure. The reflective core includes one or more of gold, aluminum, and silver, and has a diameter of from 0.5 μm to 2.0 μm. The reflective core may be attached to a first end of the second light absorbing layer, and the solar cell can further include a first electrical contact to the first light absorbing layer and a second electrical contact that electrically contacts the second light absorbing layer, wherein the second electrical contact is formed at a second end of the second light absorbing layer that is opposite to the first end.

In an implementation, the solar cell can further include a plurality of nanostructures on the barrier layer, wherein the first light absorbing layer is locally strained at each interface with each nanostructure. The first light absorbing layer can include at least one of molybdenum disulfide ($MoS_2$), molybdenum diselenide ($MoSe_2$), tungsten disulfide ($WS_2$), and tungsten diselenide ($WSe_2$). The solar cell may have a diameter of 500 nanometers, five windings, an absorption efficiency of at least 85%, and a conversion efficiency of at least 20%.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

Figure 1:
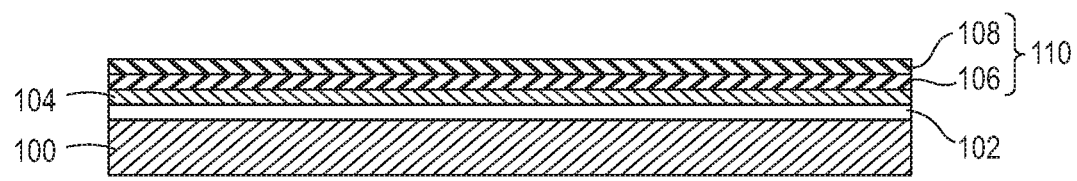
FIG. 1 is a cross section of an in-process solar cell structure during an implementation of the present teachings.

It should be noted that some details of the FIGS. have been simplified and are drawn to facilitate understanding of the present teachings rather than to maintain strict structural accuracy, detail, and scale.

DETAILED DESCRIPTION

Reference will now be made in detail to exemplary implementations of the present disclosure, examples of which are illustrated in the accompanying drawings. In the following description, reference is made to the accompanying drawings that form a part thereof, and in which is shown by way of illustration specific exemplary implementations in which the present disclosure can be practiced. These implementations are described in sufficient detail to enable those skilled in the art to practice the present disclosure and it is to be understood that other implementations can be utilized and that changes can be made without departing from the scope of the present disclosure. The following description is, therefore, merely exemplary.

According to embodiments of the present disclosure, a device including N radially stacked solar (or photovoltaic) cells and a light concentrating structure is provided. Each photovoltaic (PV) device includes a heterojunction of at least two 2D atomic crystals. The 2D atomic crystals include transition metal dichalcogenides (TMDCs). Radially stacked heterojunctions are separated by dielectric layers which are transparent to solar radiation. The light concentrating structure can be an optical cavity which concentrates the light in proximity to the radially stacked heterojunctions. As the incident radiation strikes the outermost heterostructure, only 5-10% of the light is absorbed. The rest is partly reflected and partly transmitted towards the next junction in the stack. The absorption process continues down the multilayered structure. The portion of the absorbed radiation having energy higher than the bandgap of the absorbing layer generates electron-hole pairs in each heterojunction. Two electrical contacts collect the photo-generated carriers and initiate photovoltaic conversion.

The PV device includes a rolled, curled, or spiraling tube that forms a spiral shape or spiral structure having multiple windings. Each winding includes at least two light absorbing layer (e.g., two TMDC layers) and one dielectric barrier layer, with the interface of the two light absorbers providing the heterojunction. Including three (or more) TMDC layers provides two (or more) heterojunctions, with one heterojunction at the interface of each pair of TMDC layers. The rolled-up tube may function as a ring-resonator, i.e., an optical cavity concentrating light at specific wavelengths, depending on its diameter. Metal contacts can be formed and included to collect photo-generated carriers in each light absorber. The dielectric barrier reduces, prevents, or avoids a recombination of photo-generated carrier (in one layer) in adjacent heterostructures. Each winding can include one heterojunction, two heterojunctions, or more than two heterojunctions, depending on the device design, along with the barrier layer. Stacked heterostructures formed by multiple TMDCs with different band gaps may serve to better match the solar spectrum, thereby maximizing light absorption and energy collecting. Alternatively, a broad band absorber of solar radiation can be created by establishing a varying strain field in selected 2D atomic crystals, such as $MoS_2$. An implementation can include a $MoS_2$ monolayer conformed to an array of nanoparticles, which is therefore locally strained. The nanoparticles may be nanospheres, although one of ordinary skill in the art will understand that other nanoparticles having other shapes can be used. The use of a second TMDC may improve or enable separation of the photo-generated carriers. Light absorption can also be enhanced by a reflecting element at the core of the rolled-up tube allowing the light to pass twice across the absorbing layers. An implementation may include the use of a back-reflector, for example, a metal rod, to maximize light absorption enhancement. Various structural and process implementations are discussed below and depicted in the figures.

Generally, to form the solar device of the present teachings, radially stacked heterojunctions of TMDCs in proximity to an optical cavity can be obtained using a combined top-down/bottom up approach based on rolled-up nanotech. Fabrication of the proposed device can begin with deposition of a sacrificial layer and a dielectric film. The dielectric film can be deposited using appropriate parameters to create a strain gradient across its thickness. A heterostructure of two (or more) TMDCs can be released from their growth substrates and transferred onto the substrate surface through complete removal of the bulk support. Next the stack of 2D atomic crystals, for example, one to three monolayers, can be transferred onto a dielectric barrier layer. At least two metal contacts with the TMDCs can be fabricated after this process step. Finally, upon selective removal of the sacrificial layer by chemical etching, the strain gradient in the barrier layer may relax, thereby driving the film to bend into a tube. The number of windings within the tube wall can be precisely controlled by varying the etching time of the sacrificial layer. Any portion of the film which is released from the substrate surface during etching relaxes its inherent strain by bending into a tube with a diameter "D". As the etching time increases so that the layer is released over a length "L" higher than $\pi D$, additional windings form. The number of windings "N" varies with the etching time "t" as $N=t*r/\pi D$, where "r" is the etching rate of the sacrificial layer in the selected etching solution. The rolled-up tube can then be accurately positioned on a substrate surface using top-down processing techniques. The tube or spiral may having an outside diameter of, for example, from about 0.5 micrometers ($\mu m$) to about 2.5 $\mu m$, which can be controlled by varying the thickness of the heterojunction layers and the strain gradient across the dielectric barrier layer. Additionally, the tube can have from about five to about 15 complete turns or windings that forms the spiral structure to harness the absorption within each winding as an individual component. The number of windings may be determined by the radius of the spiral structure, thickness of the heterostructure, and the absorption coefficient of the constitutive materials of the heterostructure, where each heterostructure layer includes the plurality of light absorbing layers. The number of layers of the heterostructure through a radius of the spiral, where the radius includes an outer end of the heterostructure, may be counted to measure, determine, or approximate the number of windings within the spiral structure.

In an implementation, commercially available nanospheres can be deposited on the sacrificial layer surface to form a textured surface. Next, TMDCs heterostructures can be transferred onto the textured surface. A high mechanical compliance of the 2D materials will result in their conformal deposition onto the nanospheres and the remainder of the textured surface, thereby creating a varying strain field in the films. The formation process can continue with fabrication of metal contacts and chemical etching of the sacrificial layer.

FIGS. 1-5 depict various in-process structures that may be formed during a method for forming a PV device. It will be appreciated that the in-process structures depicted herein are presented as an illustrative example, and the in-process structures may include other features that have not been depicted for simplicity, while depicted structures may be removed or modified.

FIG. 1 depicts a PV structure including a support substrate 100, a sacrificial layer 102, and a barrier layer 104. The support substrate 100 can be or include a glass layer, a bulk silicon layer such as a silicon wafer, or another layer. In an implementation, the support substrate 100 may have a thickness of from about 100 $\mu m$ to about 600 $\mu m$, a width of from about 2 inches to about 6 inches, and a length of from about 2 inches to about 6 inches, although other dimensions are contemplated. The sacrificial layer 102 can be or include a layer of germanium (Ge), photoresist such as SU-8, or silicon oxide (SiO, $SiO_2$, etc.) and may have a thickness of from about 10 nanometers (nm) to about 2000 nm. The sacrificial layer 102 may be deposited onto the support substrate 100 using any suitable method, for example, physical vapor deposition (PVD), chemical vapor deposition (CVD), and plasma-enhanced chemical vapor deposition (PECVD). The barrier layer 104 may be or include a dielectric material or electrical insulation layer, for example, aluminum oxide (e.g., $Al_xO_y$, $Al_2O_3$), silicon nitride ($Si_3N_4$), silicon oxide (e.g., $SiO_x$, $SiO/SiO_2$ bilayers), or another suitable material, and may have a thickness of from about 5 nm to about 50 nm. The barrier layer 104 may be optically transparent. The barrier layer 104 may be deposited onto the sacrificial layer 102 using any suitable method, for example, PVD, CVD, and PECVD. In general, layers 100-104 are selected such that the sacrificial layer 102 may be removed, for example using a chemical etching process, while removing a lesser amount (e.g., little or none) of the support substrate 100, the barrier layer 104, and the other layers and structures described below. In other words, the barrier layer 104 can be etched or otherwise removed selective to the support substrate 100 and the barrier layer 104. Techniques for forming a suitable sacrificial layer 102 on a support substrate 100, and a suitable barrier layer 104 on the sacrificial layer 102, are known in the art.

The barrier layer 104 is formed using a process which results in a strain gradient across its thickness. For example, the barrier layer 104 may be formed by physical vapor deposition of $SiO/SiO_2$ or atomic layer deposition (ALD) of $Al_2O_3$. Deposition of SiO and $SiO_2$ performed by electron beam (e-beam) evaporation at different deposition rates can be used to establish a strain gradient between the two dielectrics, where a high rate will lead to a higher built-in strain. Alternatively, deposition of $Al_2O_3$ via ALD at a constant rate while varying the temperature during growth will lead to a strain gradient within the layer. The strain gradient can be from about 0.5% to about 2.0%.

Subsequently, at least a first TMDC layer 106 and a second TMDC layer 108 are provided on or over the barrier layer 104, where the first TMDC layer 106 is a different material than the second TMDC layer 108 such that a heterojunction is provided at the interface between the two TMDC layers 106, 108. The TMDC layers 106, 108 may each be of the form $MX_2$, where M is a transition metal (i.e., bohrium, cadmium, chromium, cobalt, copper, dubnium, gold, hafnium, hassium, iridium, iron, manganese, meitnerium, mercury, molybdenum, nickel, niobium, osmium, palladium, platinum, rhenium, rhodium, ruthenium, rutherfordium, scandium, seaborgium, silver, tantalum, technetium, titanium, tungsten, ununbium, ununnilium, unununium, vanadium, yttrium, zinc, or zirconium) and X is a chalcogen atom (i.e., sulfur, selenium, or tellurium). Each of the TMDC layers 106, 108 may be a single molecule thick (i.e., a monolayer, to form a 2D TMDC structure), or may be more than one molecule thick. Without limiting materials to specific examples, transition metal dichalcogenides in the form $MX_2$ from which TMDC layers as disclosed herein can be formed include $MoS_2$, $MoSe_2$, $WS_2$, and $WSe_2$.

The formation of TMDC layers having a thickness of one molecule or more is known. For example, a heterostructure 110 that, in this implementation, includes the two TMDC layers 106, 108 can be initially formed on a growth substrate, released from the growth substrate, and then transferred onto the barrier layer 104. Release of the heterostructure from the growth substrate can be performed, for example, by etching or otherwise removing the growth substrate to leave the first TMDC layer 106 and the second TMDC layer 108 that forms the heterostructure. The heterostructure can be secured onto or adhered to the barrier layer 104 by thermal annealing to improve the chemical bond at the interface. After formation of the FIG. 1 structure, the heterostructure 110 can have a thickness of from about 1 nm to about 2 nm.

Figure 2:
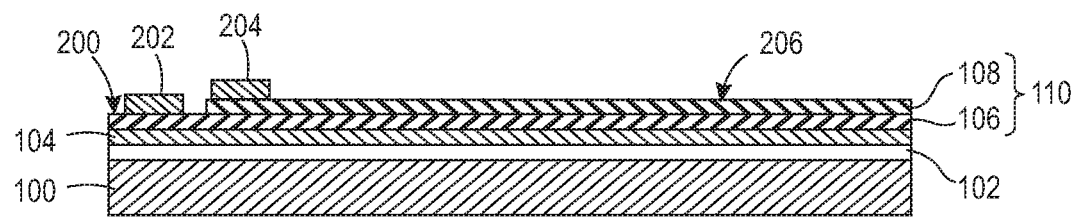
FIG. 2 depicts the FIG. 1 cross section after forming a pair of contacts.

Subsequently, a portion of the second TMDC layer 108 is removed, for example using a photolithographic process including a mask and an etch of the second TMDC layer 108 (not depicted for simplicity), to expose a surface 200 of the first TMDC layer 106 as depicted in FIG. 2. Next, a first contact 202 to the first TMDC layer 106 and a second contact 204 to the second TMDC layer 108 are formed using any suitable process including, for example, photolithography, dry etching PVD, lift-off, etc. For example, a blanket metal layer can be formed, masked, and etched using a photolithographic process to result in the structure of FIG. 2. Other formation processes are contemplated. The contacts 202, 204 may be formed from an electrically conductive material such as copper, aluminum, or another suitable metal or metal alloy. The first contact 202 on the surface 200 of the first TMDC layer 106, and the second contact 204 on a surface 206 of the second TMDC layer 108, can be used to establish electrical contact to the first TMDC layer 106 and the second TMDC layer 108 respectively. The two electrical contacts 202, 204 may be used, for example, to collect photo-generated carriers and initiate photovoltaic conversion during use of the PV device.

Subsequent to forming the FIG. 2 structure, the PV device may be separated from the support substrate 100 by etching or otherwise removing the sacrificial layer 102. For example, if the sacrificial layer 102 is formed from Ge, the sacrificial layer 102 may be removed using an etchant including water. This etchant, while removing the sacrificial layer 102, performs little or no etching of the other structures depicted in FIG. 2. The removal of the sacrificial layer 102 may be performed using any suitable process, for example, dry etching, wet etching, vapor etching, or another suitable process.

Figure 3:
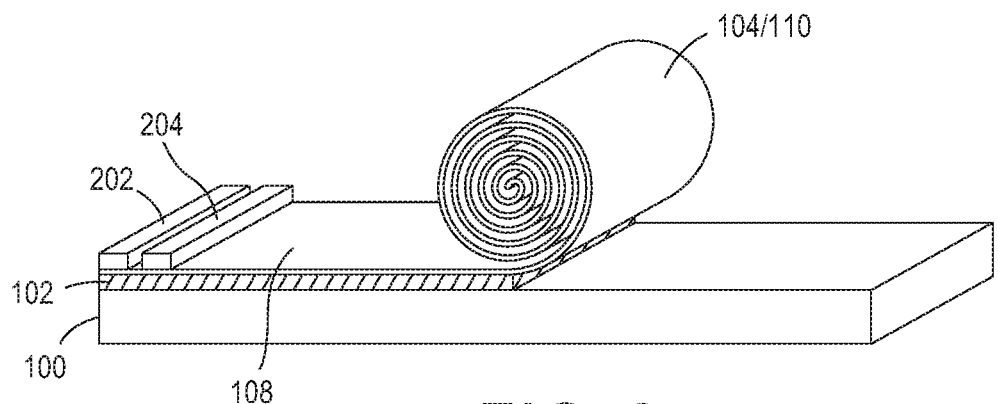
FIG. 3 is a perspective depiction of the FIG. 2 structure during a removal of a sacrificial layer.
Figure 4:
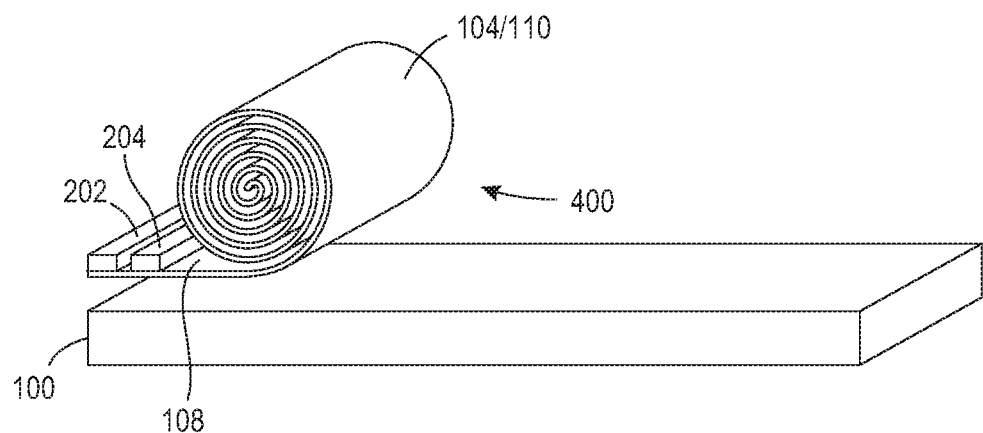
FIG. 4 is a perspective depiction of the FIG. 3 structure after removing the sacrificial layer.

As discussed above, the barrier layer 104 is initially formed to have a strain gradient across its thickness. Upon removal of the sacrificial layer 102, this strain gradient within the barrier layer 104 causes the barrier layer 104 to roll, curl, or spiral as it separates from the support substrate 100, thereby forming a number of windings of the barrier layer 104 subsequent to complete separation from the support substrate 100. FIG. 3 is a perspective depiction of the FIG. 2 structure during removal of the sacrificial layer 102, prior to complete removal of the sacrificial layer 102. The number of windings is proportional to the amount of gradient strain through the thickness of the barrier layer 104 prior to removing the sacrificial layer 102. Further, because the heterostructure 110 is attached to the barrier layer 104, this roll or spiral of the barrier layer 104 results in a roll or spiral of the heterostructure 110 as depicted in FIG. 3. Subsequent to complete removal of the sacrificial layer 102, a structure similar to that in the perspective depiction of FIG. 4 remains, where the heterostructure 110 (including the first TMDC layer 106 and the second TMDC layer 108), the first contact 202, the second contact 204, and the barrier layer 104 are separated from the support substrate 100 to form a solar cell 400.

Figure 11:
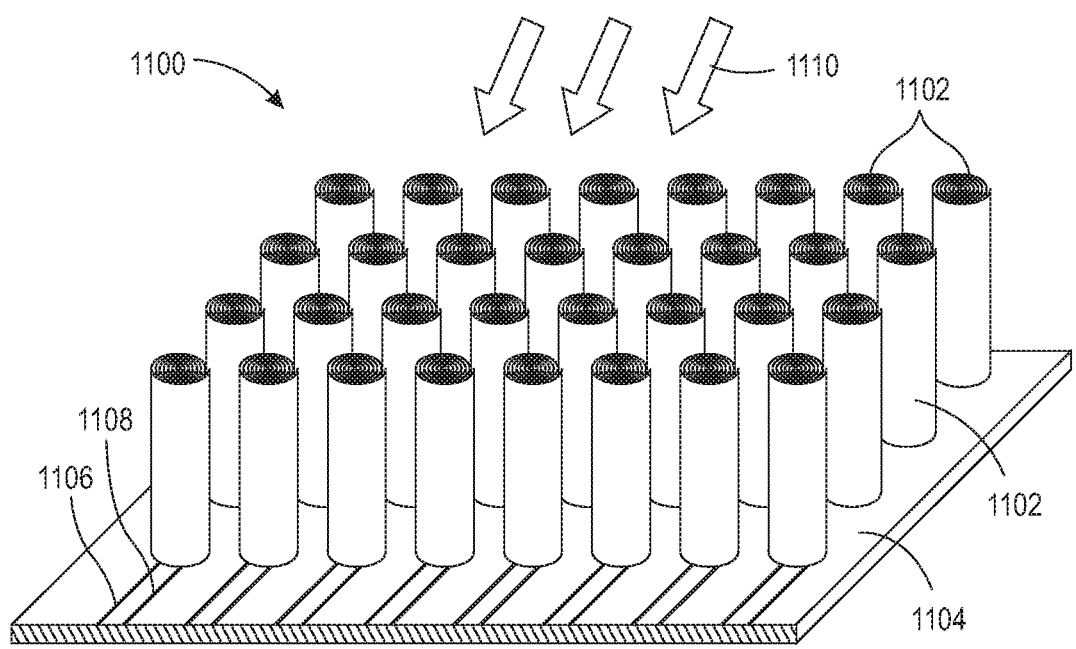
FIG. 11 is a perspective depiction of a solar cell array according to an implementation of the present teachings.

Electrical contact can be made to the heterostructure 110 using the first contact 202 and the second contact 204. The PV device can be oriented normally to the incident radiation to maximize the absorption efficiency of TE and TM modes. During use, a single tube having a diameter of about 500 nm and five windings may have an absorption efficiency estimated to be up to about 85% and a conversion efficiency estimated to be up to about 20%. An array of radially stacked cells oriented parallel to each other (e.g., as depicted in FIG. 11 and discussed below) and with a packing density of at least 80% will maximize absorption over a large area.

Figure 5:
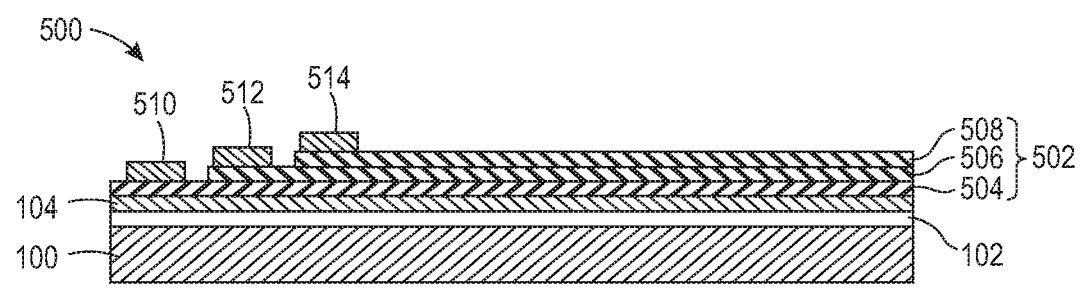
FIG. 5 is a cross section of another in-process solar cell structure during an implementation of the present teachings.

Various implementations of the present teachings are contemplated. For example, FIG. 5 depicts an in-process PV structure 500 with a heterostructure 502 that includes a first TMDC layer 504, a second TMDC layer 506, and a third TMDC layer 508. The heterostructure 502 thus includes two heterojunctions, with a first heterojunction at the interface of the first TMDC layer 504 and the second TMDC layer 506, and a second heterojunction at the interface of the second TMDC layer 506 and the third TMDC layer 508. A first contact 510 is electrically coupled to the first TMDC layer 504, a second contact 512 is electrically coupled to the second TMDC layer 506, and a third contact 514 is electrically coupled to the third TMDC layer 508. The PV structure 500 may include a support substrate 100, a sacrificial layer 102, and a dielectric barrier layer 106 as described above with reference to the description of FIGS. 1-4.

After forming the FIG. 5 in-process structure, the heterostructure 502 can be separated from the support substrate 100 by removing the sacrificial layer 102 as discussed above. The strain gradient within the barrier layer 104 causes the barrier layer 104 and the heterostructure 502 attached thereto to roll or spiral. FIG. 5 illustrates a planar PV device wherein the light absorption takes place in ultra-thin 2D layers (i.e., heterostructure 502). Absorption in 2D materials is only about 5% to 10% in the visible wavelengths compared to about 30% to 40% absorption in bulk materials. Rolling up the 2D materials into tubes as depicted, for example, in FIG. 4 results in enhanced absorption efficiency as the light is focused by the tubular structure and travels through a stack of 2D heterostructures. As discussed above, the expected absorption efficiency for each rolled 2D structure, and thus for an array parallel rolled 2D structures, is expected to be about 85% and the expected conversion efficiency is expected to be about 20%.

Figure 6:
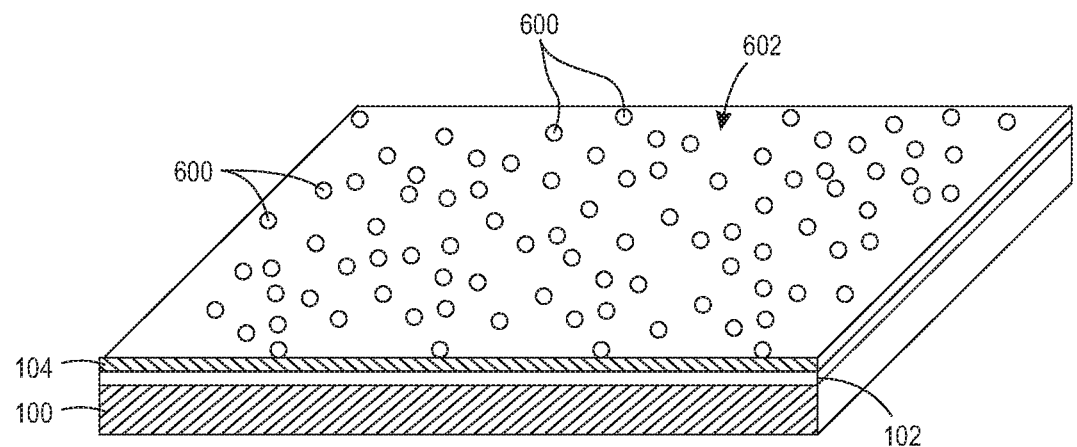
FIG. 6 is a perspective depiction of another in-process solar cell structure during an implementation of the present teachings.
Figure 7:
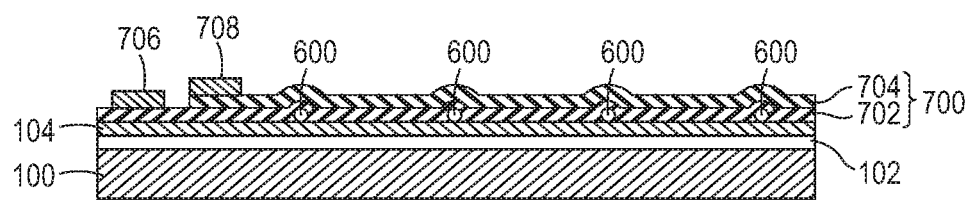
FIG. 7 is a cross section of the FIG. 6 structure subsequent to forming a pair of transition metal dichalcogenide (TMDC) layers and a pair of contacts over the FIG. 6 structure.

Another implementation is depicted in FIGS. 6 and 7, which includes a support substrate 100, a sacrificial layer 102, and a barrier layer 104 as described above with reference to FIGS. 1-4. After forming the barrier layer 104, a plurality or array of nanostructures or nanoparticles 600 such as nanospheres 600 is deposited or coated on a surface 602 of the barrier layer 104 as illustrated in the perspective depiction of FIG. 6. Each nanosphere 600 can have a diameter in the range of from about 10 nm to about 100 nm, and may be formed from, for example, $SiO_2$ using nanosphere lithography. Suitable commercially available nanospheres include those available from US Research Nanomaterials, Inc., of Houston, Tex. The nanospheres 600 may be deposited onto the surface by spin coating/dispersion, and adhere to the surface by van der Waals forces. The nanospheres 600 may be deposited onto the surface 602 at a density ranging from about 5 to about 10 nanospheres per $\mu m^2$.

Subsequently, a heterostructure 700 including at least a first TMDC layer 702 and a second TMDC layer 704 is transferred onto the FIG. 6 structure as depicted in the cross section of FIG. 7. The first TMDC layer 702 can be a TMDC material that is a broad band absorber of solar radiation. Suitable broad band solar radiation absorbers include, for example, $MoS_2$ and $WS_2$. The TMDC material selected for the first TMDC layer 702 has the physical properties of being a direct semiconductor with a tunable bandgap with respect to applied strain and an exceptionally high fracture limit, for example, about 10% strain. The thinness and flexibility of the heterostructure 700 causes it to form conformally on the nanospheres, thereby establishing and resulting in a varying strain field in the 2D atomic crystals of the heterostructure 700, particularly in the solar radiation-absorbing first TMDC layer 702. The first TMDC layer 702 can therefore be or include a $MoS_2$ monolayer conformed to the array of nanoparticles 600, which is thereby locally strained (e.g., has a locally varying strain field) at each interface with each nanosphere. During use of the PV device, the second TMDC layer 704 enables separation of photo-generated carriers.

Subsequently, a first electrical contact 706 and a second electrical contact 708 are formed to electrically contact the first TMDC layer 702 and the second TMDC layer 704 respectively as depicted in FIG. 7, for example, as discussed above with reference to FIGS. 1-4. The sacrificial layer 102 of FIG. 7 can be etched as discussed above to separate the support substrate 100 from the other structures 104-708. As discussed above with reference to FIG. 4, the strain gradient across the thickness of the barrier layer 104 causes the heterostructure 700 to roll or spiral, thereby resulting in a structure similar to that depicted in FIG. 4, and additionally including nanospheres 600. Additional processing can be performed to form a solar radiation collecting PV device from the heterostructure 700 and electrical contacts 706, 708.

Figure 8:
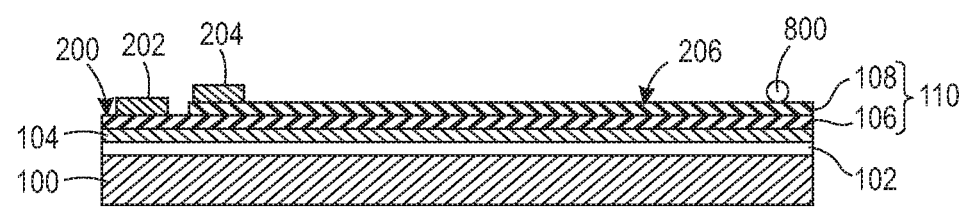
FIG. 8 is a cross section of another in-process solar cell structure during an implementation of the present teachings.
Figure 9:
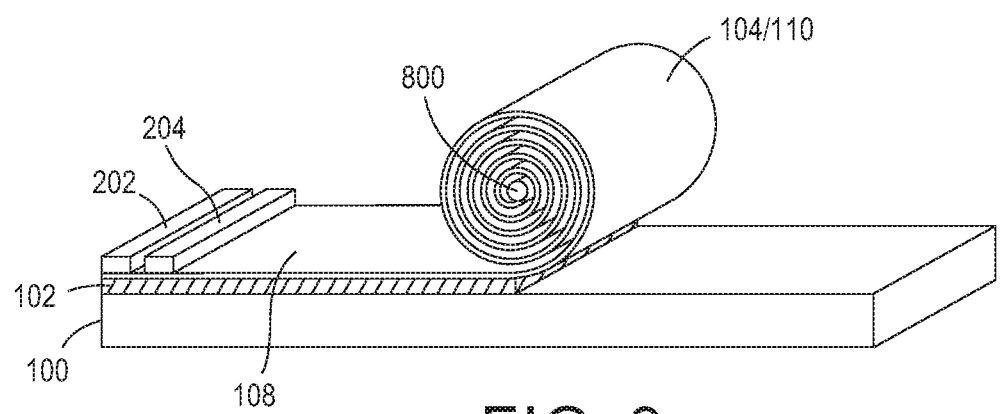
FIG. 9 is a perspective depiction of the FIG. 8 structure during a removal of a sacrificial layer.

Another implementation is depicted in the cross section of FIG. 8 and the perspective depiction of FIG. 9. This option is discussed relative to the structure of FIG. 2, but it will be understood that it may be used with any, all, or none of the implementations. This option includes a reflective core (i.e., reflective rod, back reflector, metal rod) 800 attached to the surface 206 of the second TMDC layer 108, for example, at, near, or in proximity of a first end of the second TMDC layer 108 that is opposite to a second end of the TMDC layer 108, where the second contact 204 is attached at, near, or in proximity of the second end. The reflective core 800 can have a diameter (e.g., measured as an average diameter across the length of the reflective core 800) of from about 0.5 µm to about 2.0 µm, and a length that matches the length of the tube (e.g., is the same or about the same length as the completed tube structure). The reflective core 800 may be manufactured from one or more of aluminum, gold, and silver. In an implementation, the reflective core 800 can have a reflectivity of at least 95%, or a reflectivity of from about 90% to about 98%. The reflective core 800 can be manufactured using any suitable process, for example, e-beam lithography, dry etching, PVD, lift-off, electrospinning, etc. Commercially available microrods include product number 716960 from Sigma-Aldrich Co. LLC of Saint Louis, Mo. After attaching the reflective core 800, forming the first contact 202 and the second contact 204, the sacrificial layer 102 can be removed as discussed above. FIG. 9 is a perspective depiction of the in-process structure during removal of the sacrificial layer 102. After completing the removal of the sacrificial layer 102, the reflective core 800 is at or near a center of the completed solar cell.

In use, the reflective core 800 can improve energy collection by reflecting light that travels through the heterostructure 110 and to the reflective core 800 back into the heterostructure 110.

Figure 10:
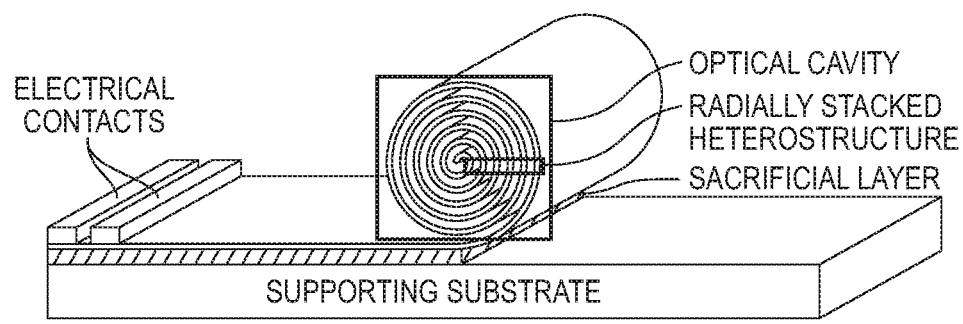
FIG. 10 is a perspective depiction of an in-process solar cell according to an implementation of the present teachings.

Implementations of the present teachings thus provide radially stacked light absorbing layers that provide a heterostructure in the form of a roll, spiral, or cylinder as depicted in FIG. 10. The light absorbing layers may be or include two 2D atomic crystals such as two TMDC layers, wherein the two light absorbing layers are different, such that a heterojunction is provided at the interface of the two light absorbing layers. A solar radiation collection device such as a solar cell in accordance with the present teachings may have a higher absorption efficiency and conversion efficiency compared to prior solar radiation collection devices, particularly compared to prior photovoltaic cells. The radially stacked TMDC layers provide an optical cavity such as a light concentrating optical cavity having multiple TMDCs with different band gaps that may better match the solar spectrum compared to some prior devices, thereby improving light absorption and energy collecting.

FIG. 11 is a perspective depiction of a PV device including a solar cell array 1100 having a plurality of spiral solar cells 1102 assembled onto a substrate 1104, wherein each spiral solar cell 1102 is formed as described above. While FIG. 11 depicts a 4×8 array of solar cells 1102, other array sizes are contemplated. The first contact 202 and the second contact 204 of each solar cell 400 (FIG. 4) of the solar cell array 1100 are electrically coupled to a first interconnect 1106 and a second interconnect 1108 respectively as depicted in FIG. 11. The first and second interconnects 1106, 1108 are routed, for example, to an edge of the substrate 1104 for energy collection, or to another location appropriate for the specific design of the solar cell array 1100. Various electrical connection schemes suitable for energy collection and/or storage will become apparent to one of ordinary skill in the art from the description herein. It will be appreciated that FIG. 11 depicts an exemplary solar array 1100 for collection of solar energy 1110, and at an actual solar array 1100 may include other structures that have not been depicted for simplicity, while depicted structures may be removed or modified.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

As used herein, the terms "inner" and "outer"; "up" and "down"; "upper" and "lower"; "upward" and "downward"; "above" and "below"; "inward" and "outward"; and other like terms as used herein refer to relative positions to one another and are not intended to denote a particular direction or spatial orientation. The terms "couple," "coupled," "connect," "connection," "connected," "in connection with," and "connecting" refer to "in direct connection with" or "in connection with via one or more intermediate elements or members."

What is claimed is:

1. A solar cell, comprising:
   a barrier layer;
   a plurality of nanospheres positioned on the barrier layer, wherein the plurality of nanospheres comprise silicon dioxide;
   a heterostructure wherein:
      the heterostructure comprises a first light absorbing layer and at least a second light absorbing layer attached to the first light absorbing layer; and
      the plurality of nanospheres are positioned between the barrier layer and the heterostructure; and
   a heterojunction at an interface between the first light absorbing layer and the second light absorbing layer, wherein the barrier layer, the first light absorbing layer, and the second light absorbing layer form a spiral structure having a spiral shape.

2. The solar cell of claim 1, wherein:
   the first light absorbing layer is a first transition metal dichalcogenide (TMDC) layer having a band gap;
   the second light absorbing layer is a second TMDC layer having a band gap; and
   the first TMDC layer is a different material having a different band gap than the second TMDC layer.

3. The solar cell of claim 1, wherein the spiral structure comprises at least five windings.

4. The solar cell of claim 1, further comprising:
   a first electrical contact that electrically contacts the first light absorbing layer; and
   a second electrical contact that electrically contacts the second light absorbing layer.

5. The solar cell of claim 1, further comprising a reflective core attached to the second light absorbing layer, wherein the reflective core is positioned at a center of the spiral structure.

6. The solar cell of claim 5, wherein the reflective core comprises one or more of gold, aluminum, and silver, and has a diameter of from 0.5 micrometer (µm) to 2.0 µm.

7. The solar cell of claim 6, wherein the reflective core is attached to a first end of the second light absorbing layer, and the solar cell further comprises:
   a first electrical contact that electrically contacts the first light absorbing layer; and
   a second electrical contact that electrically contacts the second light absorbing layer, wherein the second electrical contact is formed at a second end of the second light absorbing layer that is opposite to the first end.

8. The solar cell of claim 1, wherein the first light absorbing layer is locally strained at each interface with each nanosphere.

9. The solar cell of claim 8, wherein the first light absorbing layer comprises at least one of molybdenum disulfide ($MoS_2$), molybdenum diselenide ($MoSe_2$), tungsten disulfide ($WS_2$), and tungsten diselenide ($WSe_2$).

10. The solar cell of claim 1, wherein the solar cell has a diameter of 500 nanometers, at least five windings, an absorption efficiency of at least 85%, and a conversion efficiency of at least 20%.

11. The solar cell of claim 1, wherein each nanosphere of the plurality of nanospheres has a diameter of from 10 nanometers (nm) to 100 nm.

12. The solar cell of claim 1, wherein the plurality of nanospheres are positioned on the barrier layer at a density of from 5 nanospheres per square micrometer to 10 nanospheres per square micrometer.

13. The solar cell of claim 1, wherein:
   each nanosphere of the plurality of nanospheres has a diameter of from 10 nanometers (nm) to 100 nm;

the plurality of nanospheres are positioned on the barrier layer at a density of from 5 nanospheres per square micrometer to 10 nanospheres per square micrometer; and the first light absorbing layer is locally strained at each interface with each nanosphere.

\* \* \* \* \*